US009637821B2

(12) United States Patent
Slevin et al.

(10) Patent No.: US 9,637,821 B2
(45) Date of Patent: May 2, 2017

(54) METHOD FOR SUPPLYING VAPORIZED PRECURSOR

(71) Applicant: Lam Research Corporation, Fremont, CA (US)

(72) Inventors: Damien Slevin, Salem, OR (US); Brad Laird, Sherwood, OR (US); Curtis Bailey, West Linn, OR (US); Ming Li, West Linn, OR (US); Sirish Reddy, Hillsboro, OR (US); James Sims, Tigard, OR (US); Mohamed Sabri, Beaverton, OR (US); Saangrut Sangplug, Sherwood, OR (US)

(73) Assignee: LAM RESEARCH CORPORATION, Fremont, CA (US)

( * ) Notice: Subject to any disclaimer, the term of this patent is extended or adjusted under 35 U.S.C. 154(b) by 689 days.

(21) Appl. No.: 14/096,508

(22) Filed: Dec. 4, 2013

(65) Prior Publication Data

US 2014/0096834 A1 Apr. 10, 2014

Related U.S. Application Data

(62) Division of application No. 12/892,279, filed on Sep. 28, 2010, now Pat. No. 8,628,618.

(Continued)

(51) Int. Cl.
*C23C 16/455* (2006.01)
*C23C 16/448* (2006.01)
*C23C 16/44* (2006.01)

(52) U.S. Cl.
CPC .... *C23C 16/45589* (2013.01); *C23C 16/4402* (2013.01); *C23C 16/4486* (2013.01); *C23C 16/45561* (2013.01); *Y10T 137/0318* (2015.04)

(58) Field of Classification Search
CPC .......... C23C 16/45589; C23C 16/4402; C23C 16/4486; Y10T 137/0318

(Continued)

(56) References Cited

U.S. PATENT DOCUMENTS 4,640,221 A 2/1987 Barbee et al.
4,717,596 A 1/1988 Barbee et al.

(Continued)

FOREIGN PATENT DOCUMENTS

KR 10-0181904 4/1999
KR 10-2002-0037130 5/2002

(Continued)

OTHER PUBLICATIONS

The International Search Report and Written Opinion for corresponding International Application No. PCT/US2010/050691, 12 pages.

*Primary Examiner* — Jeffrie R Lund

(57) ABSTRACT

A method for supplying vapor to a chamber includes providing a first diverter valve that, when open, diverts vapor away from the chamber, and a second diverter valve that, when open, supplies the vapor to the chamber; supplying a carrier gas to the chamber; after supplying the carrier gas, creating plasma in the chamber while a substrate is in the chamber; opening the first diverter valve and closing the second diverter valve; supplying the vapor by vaporizing at least one liquid precursor in a carrier gas; after a first predetermined period sufficient for the vapor to reach steady-state flow, closing the first diverter valve and opening the second diverter valve to supply the vapor to the chamber; and after a second predetermined period following the first predetermined period, opening the first diverter valve and closing the second diverter valve to stop supplying the vapor to the chamber.

11 Claims, 9 Drawing Sheets

Related U.S. Application Data

(60) Provisional application No. 61/246,889, filed on Sep. 29, 2009.

(58) Field of Classification Search
USPC ........................................ 118/715, 726, 723 R
See application file for complete search history.

(56) References Cited

U.S. PATENT DOCUMENTS

| | | | |
|---|---|---|---|
| 5,284,789 A | 2/1994 | Mori et al. | |
| 5,562,952 A | 10/1996 | Nakahigashi et al. | |
| 5,595,603 A | 1/1997 | Klinedinst et al. | |
| 5,620,524 A | 4/1997 | Fan et al. | |
| 6,328,804 B1 | 12/2001 | Murzin et al. | |
| 6,409,839 B1 | 6/2002 | Sun et al. | |
| 6,893,983 B2 | 5/2005 | Sun et al. | |
| 8,017,527 B1 | 9/2011 | Dhas et al. | |
| 8,297,223 B2 | 10/2012 | Liu et al. | |
| 8,628,618 B2 * | 1/2014 | Slevin .............. | C23C 16/4402 118/715 |
| 8,679,253 B2 * | 3/2014 | Furuya ............... | C23C 16/452 118/715 |
| 2002/0144657 A1 | 10/2002 | Chiang et al. | |
| 2002/0192375 A1 | 12/2002 | Sun et al. | |
| 2004/0119145 A1 | 6/2004 | Sun et al. | |
| 2004/0163590 A1 | 8/2004 | Tran et al. | |
| 2005/0031495 A1 | 2/2005 | Choi et al. | |
| 2007/0004186 A1 | 1/2007 | Yoshii et al. | |
| 2009/0050210 A1 | 2/2009 | Choi et al. | |
| 2009/0084315 A1 | 4/2009 | Liu et al. | |
| 2010/0151261 A1 | 6/2010 | Ma et al. | |
| 2010/0219157 A1 | 9/2010 | Matsumoto | |
| 2011/0111136 A1 | 5/2011 | Slevin et al. | |
| 2014/0096834 A1 * | 4/2014 | Slevin ............... | C23C 16/4402 137/1 |

FOREIGN PATENT DOCUMENTS

| | | |
|---|---|---|
| KR | 10-2005-0111681 | 11/2005 |
| KR | 10-2007-0120462 | 12/2007 |

* cited by examiner

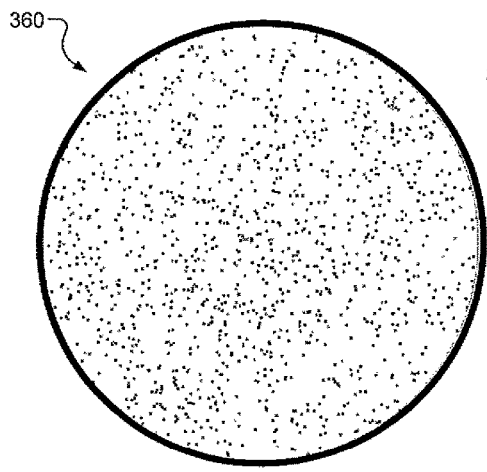
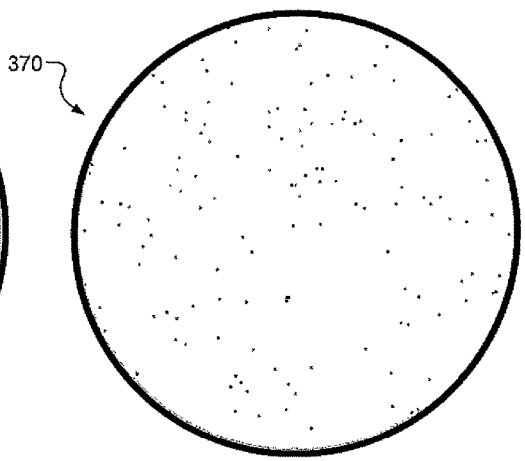
FIG. 8A    FIG. 8B
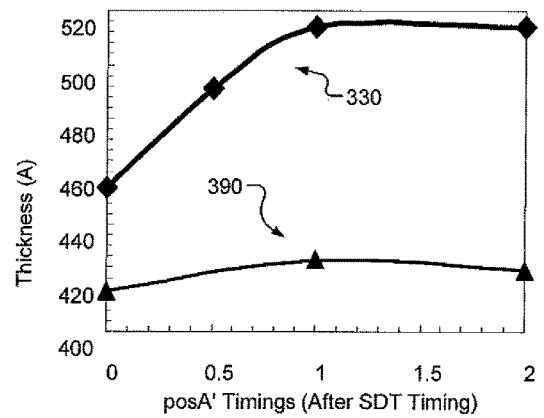
FIG. 9
| | > 0.1 µm | > 0.2 µm |
|---|---|---|
| Average | 20 | 9 |
| Standard Dev. | 9 | 4 |
| Median | 22 | 7 |
FIG. 10A
| | > 0.07 µm | > 0.1 µm | > 0.2 µm |
|---|---|---|---|
| Average | 9 | 4 | 2 |
| Standard Dev. | 7 | 3 | 3 |
| Median | 8 | 3 | 1 |
FIG. 10B

METHOD FOR SUPPLYING VAPORIZED PRECURSOR

CROSS-REFERENCE TO RELATED APPLICATIONS

This application is a divisional of U.S. application Ser. No. 12/892,279, filed Sep. 28, 2010, which claims the benefit of U.S. Provisional Application No. 61/246,889, filed on Sep. 29, 2009. The entire disclosures of the above applications are incorporated herein by reference.

FIELD

The present disclosure relates to vapor generation and delivery systems, and more particularly to vapor generation and delivery systems for chemical vapor deposition (CVD) systems.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Plasma-enhanced chemical vapor deposition (PECVD) is a type of plasma deposition that is used to deposit thin films from a gas state (i.e. vapor) to a solid state on a substrate such as a wafer. PECVD systems convert a liquid precursor into a vapor precursor, which is delivered to a chamber. PECVD systems may include a vaporizer that vaporizes the liquid precursor in a controlled manner to generate the vapor precursor.

SUMMARY

A vapor delivery system for supplying vapor to a chamber in a plasma-enhanced chemical vapor deposition (PECVD) system includes a vapor supply that supplies vapor by vaporizing at least one liquid precursor in a carrier gas. A first path includes a first filter that filters the vapor flowing from the vapor supply to the chamber. At least one second path is parallel to the first path and includes a second filter that filters vapor flowing from the vapor supply to the chamber. A plurality of valves are configured to switch delivery of the vapor to the chamber between the first path and the second path.

In other features, a vapor delivery system for supplying vapor to a chamber in a plasma-enhanced chemical vapor deposition (PECVD) system includes a vapor supply that supplies vapor by vaporizing at least one liquid precursor in a carrier gas. A diverter includes a first diverter valve that, when open, diverts the vapor away from the chamber, and a second diverter valve that, when open, diverts the vapor to the chamber. The carrier gas is supplied at a first time. Plasma is created in the chamber at a second time after the first time. The first diverter valve is open and the second diverter valve is closed at a third time, which is after the second time, when the at least one liquid precursor is supplied to divert the vapor away from the chamber. The first diverter valve is closed and the second diverter valve is open at a fourth time, after the third time, when the at least one liquid precursor is supplied to supply the vapor to the chamber.

Further areas of applicability of the present disclosure will become apparent from the detailed description provided hereinafter. It should be understood that the detailed description and specific examples are intended for purposes of illustration only and are not intended to limit the scope of the disclosure.

BRIEF DESCRIPTION OF THE DRAWINGS

The drawings described herein illustrate selected embodiments and not all possible implementations, and are not intended to limit the scope of the present disclosure.

FIGS. 8A and 8B illustrate adders on a conventional wafer and on a wafer processed according to the present disclosure, respectively;

FIG. 9 illustrates thickness as a function of time for a conventional wafer and a wafer processed according to the present disclosure, respectively;

FIGS. 10A and 10B are charts illustrating adders for a conventional wafer and a wafer processed according to the present disclosure;

DETAILED DESCRIPTION

Figure 1:
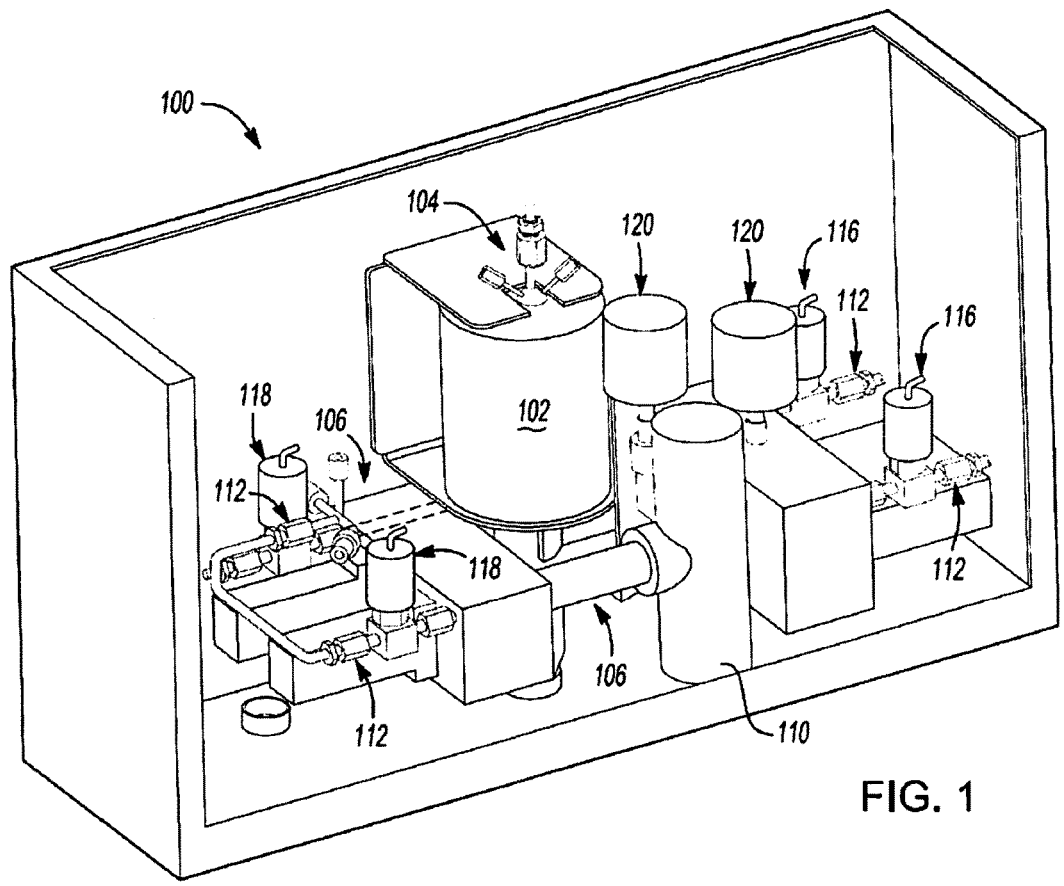
FIG. 1 is a perspective view of a precursor vapor generation and delivery system according to the present disclosure.

The following description is merely exemplary in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical OR. It should be understood that steps within a method may be executed in different order without altering the principles of the present disclosure.

A delivery system may be used to filter and controllably deliver vaporized precursor to a chamber in a plasma-enhanced chemical vapor deposition (PECVD) system. The delivery system may include a conduit, one or more valves and a filter to filter the vaporized precursor. Over time, the filter may become clogged and may not filter the vaporized precursor efficiently. It may be difficult to identify when the filter needs to be changed. In addition, changing the filter typically requires the PECVD system to be shut down. A precursor vapor generation and delivery system according to the present disclosure provides multiple paths for the flow of the vapor precursor. Accordingly, the flow of the vapor precursor can be changed from one or more paths to one or more other paths. For example, the precursor vapor generation and delivery system may switch the vapor precursor delivery path from a path with a clogged filter to a path with a clean filter and continue operation with little or no down time.

Figure 3:
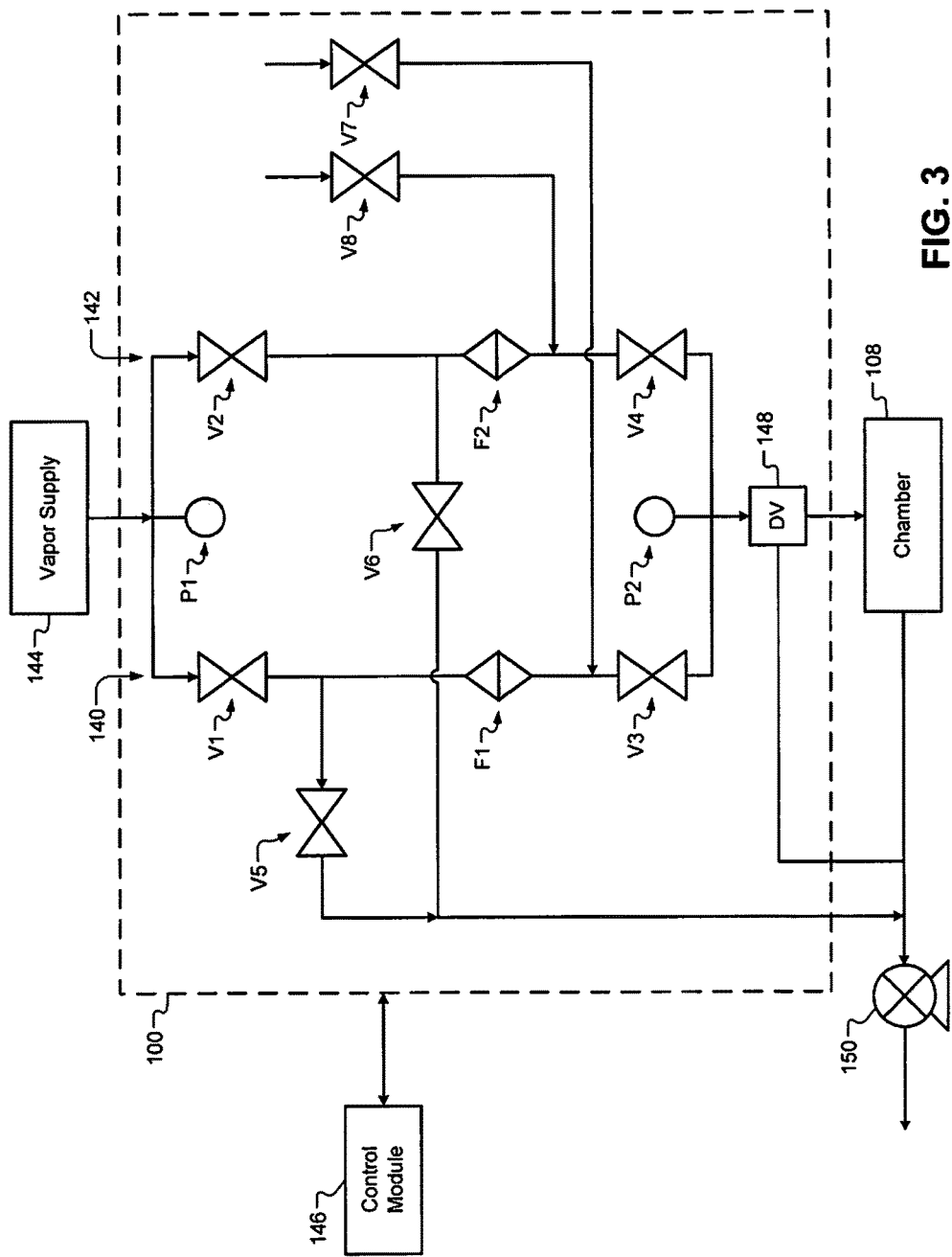
FIG. 3 illustrates the delivery system with integrated filters according to the present disclosure.

Referring now to FIG. 1, a precursor vapor generation and delivery system 100 is shown. The system 100 includes a heat exchanger 102, a vaporizer 104, two or more parallel vapor precursor delivery paths 106 (i.e. at least one redundant path) and a chamber 108 (as shown in FIG. 3). Each of the vapor precursor delivery paths 106 includes a filter 110. The filter 110 may include a heating jacket for temperature control. Zero, one or more of the vapor precursor delivery paths 106 can be selected by a control module (described below in FIG. 3) using gate valves 112. A diverter (not shown in FIG. 1) allows the vapor precursor to be diverted or supplied to the chamber 108. Other valves (e.g. purge valves 116 and/or vacuum valves 118) are used during a purge operation of the filters 110. For example only, the purge operation may be used when changing from one type of precursor to another.

Pressure manometers 120 are used to monitor pressures in the vapor precursor delivery paths 106. The control module (as shown in FIG. 3) monitors outputs of the pressure manometers 120 and generates a pressure differential. A filter clean/dirty status may be determined based on the pressure differential and one or more predetermined thresholds. As a result, the control module may be used to determine when the filter 110 in a particular path 106 needs to be changed. The control module may also use two or more different pressure differential thresholds depending upon the type of precursor that is being supplied.

By providing multiple paths, the flow of vapor precursor can be changed from one or more paths to one or more other paths very quickly if needed instead of shutting down the system 100 to change the filter. As a result, the precursor vapor generation and delivery system 100 may provide improved uptime. This is due in part to the ability of the precursor vapor generation and delivery system 100 to switch the vapor precursor delivery path from a path with a clogged filter to a path with a clean filter and subsequently continue operation. In addition, the paths from the vaporizer through the heat exchanger/filter to the chamber are heated by filter, conduit and/or valve heating units. More uniform heating reduces the incidence of particles in the system 100.

Figure 2:
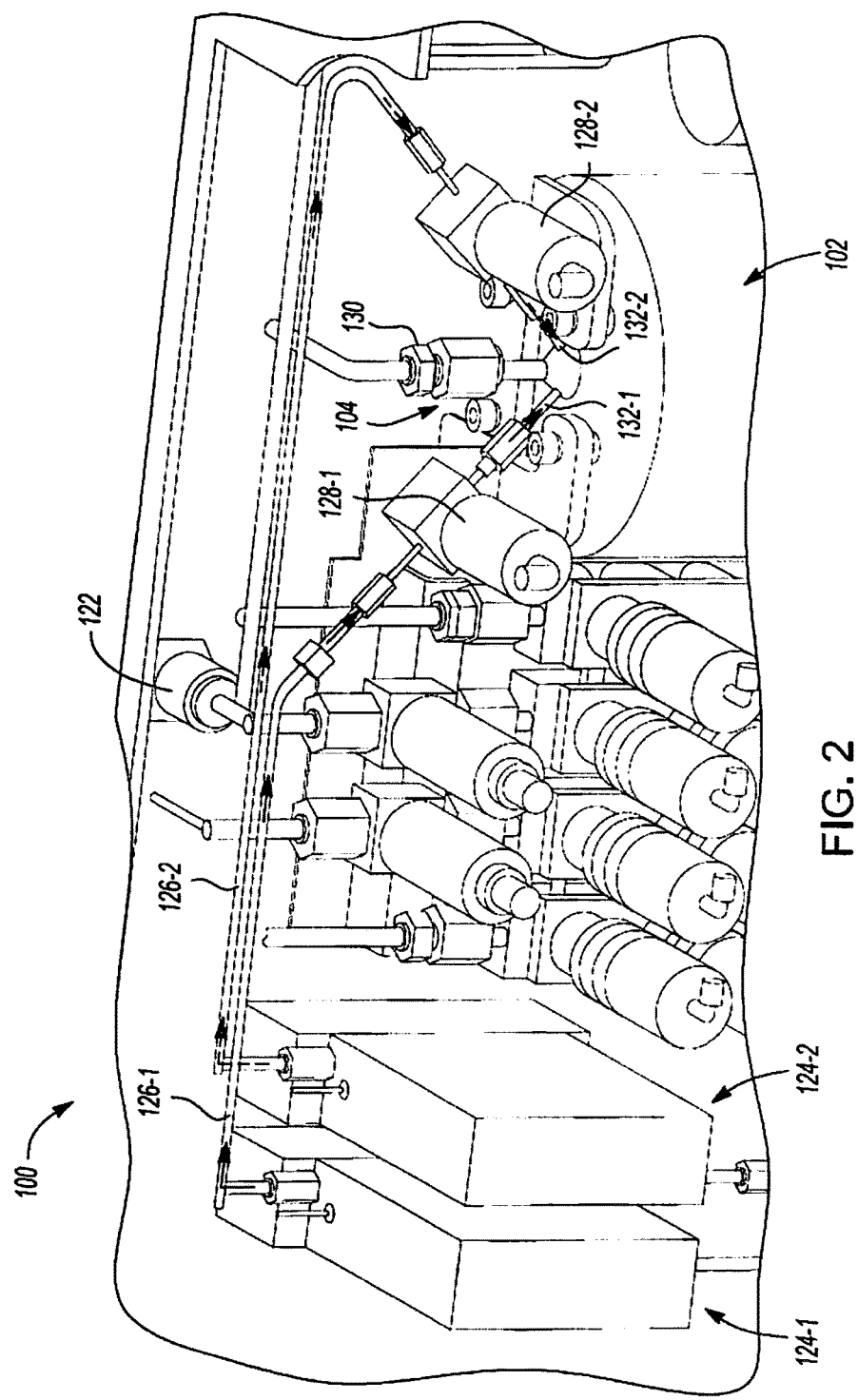
FIG. 2 is a perspective view illustrating delivery of multiple liquid precursors to a vaporizer according to the present disclosure.

Referring now to FIG. 2, multiple liquid precursors may be supplied to the vaporizer 104. First and second liquid precursors are supplied via various conduits, pumps and valves to the vaporizer 104. The liquid precursors enter the system 100 from a liquid precursor supply 122. The first liquid precursor is supplied from the liquid precursor supply 122 to the vaporizer 104 via a flow controller/pump 124-1 and a conduit 126-1. A flow meter 128-1 may be used to monitor the flow of the first liquid precursor. Similarly, the second liquid precursor is supplied from the liquid precursor supply 122 to the vaporizer 104 via a flow controller/pump 124-2 and a conduit 126-2. A flow meter 128-2 may be used to monitor the flow of the second liquid precursor. A carrier gas is supplied the vaporizer 104 through a restrictor orifice 130.

The conduit 126-1 may include a narrow portion at, for example, 132-1. A diameter of the narrow portion 132-1 is smaller than a diameter of other portions of the conduit 126-1. Consequently, pressure and velocity of the first liquid precursor flowing through the narrow portion 132-1 is increased. The increased pressure and velocity of the first liquid precursor reduces droplet size and intensifies the shearing effect of atomization. Similarly, the conduit 126-2 may include a narrow portion at, for example, 132-2.

Referring now to FIG. 3, an exemplary implementation of the delivery system 100 is shown in further detail. The delivery system 100 in FIG. 3 includes first and second paths 140, 142. When supplying vapor precursor via the first path 140, valves V1 and V3 are open and the remaining valves V2 and V4-V8 are closed. Vapor precursor flows through the valve V1, filter F1 and the valve V3 to the chamber 108. The first path 140 from vapor supply 144 to the 108 chamber is heated. A control module 146 actuates the valves V1-V8 and monitors pressure manometers P1 and P2 to determine the pressure differential. A diverter valve (DV) 148 diverts flow from the paths 140, 142 to either the chamber 108 or a vacuum pump 150.

When the measured pressure differential exceeds a predetermined value, the control module 146 switches to the second path 142. For example, the control module 146 may activate an indicator (e.g. on a display or other external user interface; not shown) to inform a user of the system 100 that the filter F1 in the first path 140 is dirty. Accordingly, the user may interface with the system 100 (e.g. via the control module 146 or other inputs) to switch from the first path 140 to the second path 142. Additionally, the control module 146 may be configured to automatically switch from the first path 140 to the second path 142 when the pressure differential exceeds the predetermined value.

When supplying vapor precursor via the second path 142, the valves V2 and V4 are open and the remaining valves V1, V3, and V5-V8 are closed. Vapor precursor flows through the valve V2, filter F2 and the valve V4 to the chamber 108. The second path 142 from the vapor supply 144 to the chamber 108 is also heated. The control module 146 actuates the valves V1-V8 and monitors the pressure manometers P1 and P2 to determine the pressure differential. When the measured pressure differential exceeds the predetermined value, the system 100 is switched back to the first path 140.

One or more of the filters F1, F2 may be changed when the pressure differential indicates that one of the filters F1, F2 is dirty. For example, one of the filters F1, F2 may be changed when the system 100 is next shut down for maintenance or another purpose. Alternatively, a user may wait until both filters F1, F2 are dirty before shutting down the system 100 to change the filters F1, F2. The system 100 may be arranged such that while supplying vapor precursor via the first path 140, the filter F2 in the second path 142 can be changed, and while supplying vapor precursor via the second path 142, the filter F1 in the first path 140 can be changed. Accordingly, shutting down the system 100 prior to changing one of the filters F1, F2 would not be required.

As can be appreciated, additional paths can be provided. Furthermore, vapor precursor can be supplied by two or more of the parallel paths 140, 142 at the same time to increase flow rates. Furthermore, while the pressure manometers P1, P2 as shown in FIG. 3 are arranged at junctions between the vapor supply 144 and the first and second paths 140, 142 and between the first and second paths 140, 142 and the chamber 108, pairs of pressure manometers can be arranged in each path 140, 142 to separately monitor the pressure differential in each path 140, 142. This may be desirable when multiple paths are used at the same time. In other words, a system 100 with three paths may use one, two or three paths at a given time. When supplying the vapor precursor with two paths 140, 142, one of the two paths 140, 142 may have a clogged filter F1 or F2. The path with the clogged filter can be replaced by the remaining path with a clean filter. Monitoring pressure on each path 140, 142 allows the control module 146 to differentiate between the two operating paths 140, 142 in this case.

A purge operation may be performed. For example only, the purge operation may be performed when changing from one vapor precursor to another and/or when a mixture of precursors changes (such as when a concentration changes). Generally, a dirty filter will be purged when the control module 146 switches to another path with a clean filter because the dirty filter is clogged. When purging one of the filters F1, F2, the valves V1, V2, V3 and V4 are closed. To purge the filter F2, the valves V8 and V6 are opened to allow purge gas to flow into the valve V8, backwards through the filter F2, and through the valve V6. In some implementations, opening of the valves V8 and V6 is alternated to build up and release the purge gas so that enhanced purging of the filter may be performed. In other words, the valve V8 may be opened while the valve V6 is closed to allow the purge gas to reach the filter F2 and build up pressure. The vacuum pump 150 builds up vacuum as well. Then, the valve V8 is closed and the valve V6 is opened. A similar approach may be used to purge the filter F1.

Figure 4:
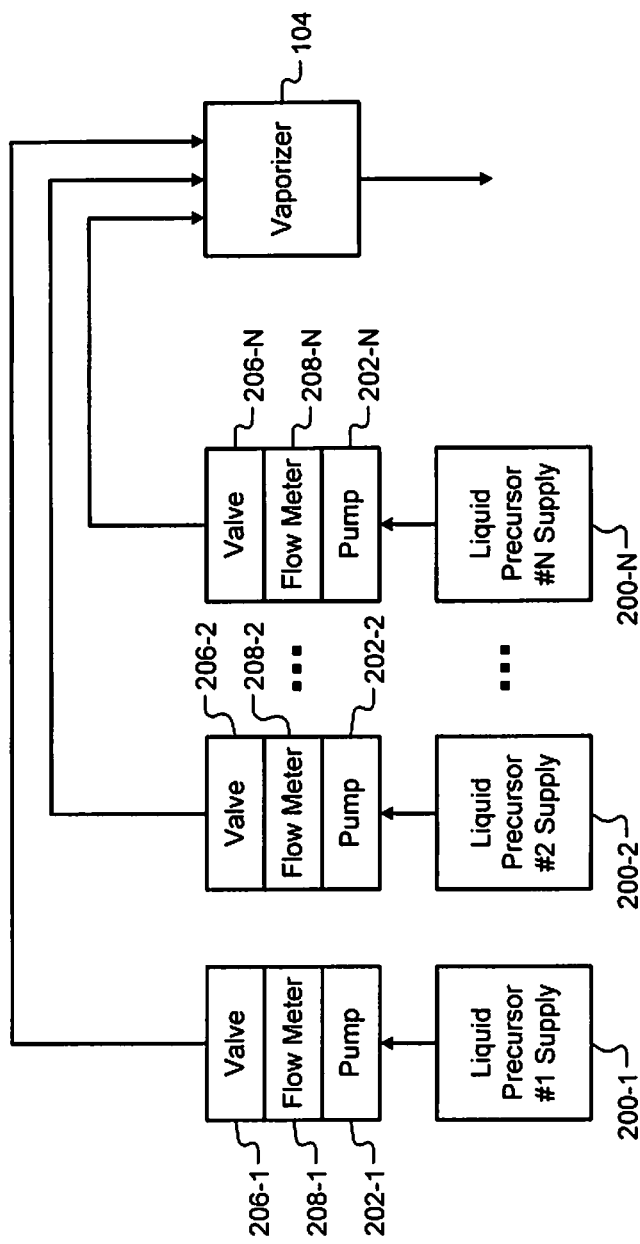
FIG. 4 is a functional block diagram illustrating delivery of N liquid precursors to the vaporizer according to the present disclosure.

Referring now to FIG. 4, delivery of multiple liquid precursors to the vaporizer 104 is shown. While FIG. 2 shows the delivery of two liquid precursors, the system 100 may supply any number N of liquid precursors from supplies 200-1, 200-2, ..., 200-N (referred to collectively as supplies 200). Each of the liquid precursors may be supplied via pumps 202-1, 202-2, ..., 202-N (referred to collectively as pumps 202) and valves 206-1, 206-2, ..., 206-N (referred to collectively as valves 206). Flow meters 208-1, 208-2, ..., 208-N (referred to collectively as flow meters 208) may also be used to allow metering of the valves 206 to be controlled more precisely.

Some vaporizers do not atomize high flow liquid precursors such as tetraethyl orthosilicate (TEOS) effectively, thereby limiting process capabilities and leading to poor particle performance. Poor vaporization of TEOS based liquid precursor may occur during process steps in which plasma is not turned on. For example, a wafer that has been exposed to carrier gases like oxygen when decorated with other films (like ashable hard mask (AHM)) does not contribute adders. However, a wafer exposed to oxygen and TEOS when decorated with other films may lead to a significant number of adders.

Figure 5:
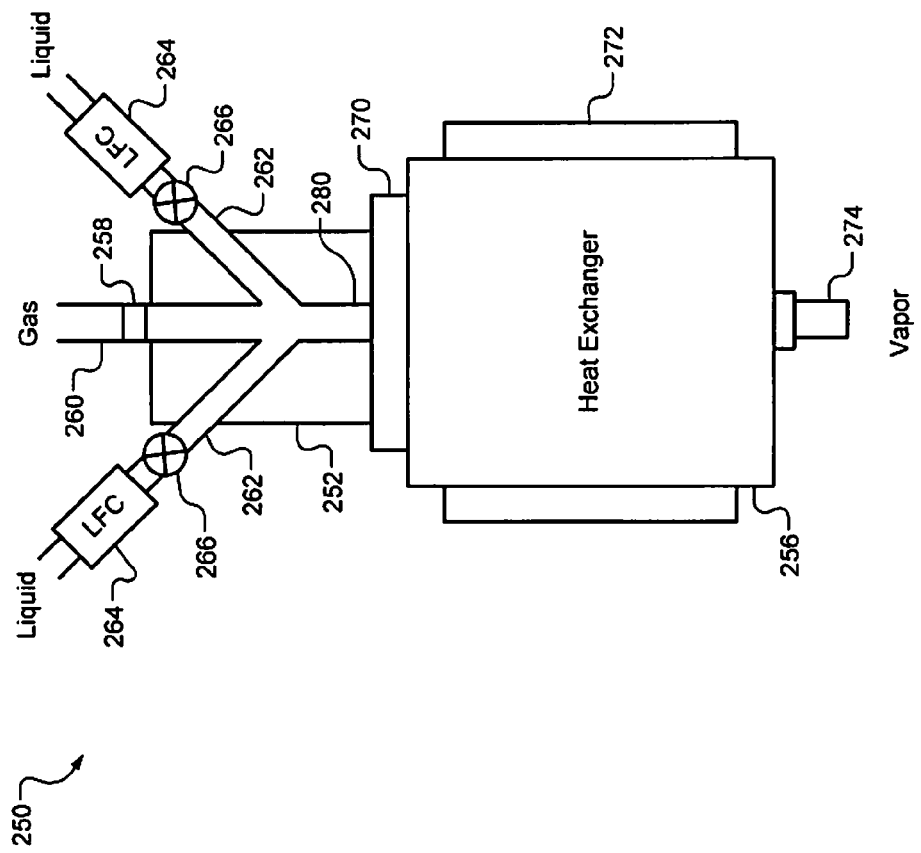
FIG. 5 is a cross-sectional view illustrating an exemplary vaporizer according to the present disclosure.

Referring now to FIG. 5, an exemplary vaporizer 250 according to the present disclosure is shown. The vaporizer 250 includes an atomizer 252 and a heat exchanger/filter 256. For example only, the heat exchanger/filter 256 may be implemented by a Turbo Vaporizer as manufactured by MSP Corporation, though other suitable heat exchanger/filters may be used. A restrictor orifice 258 may be arranged at an inlet 260 of the atomizer 252. A carrier gas flows through the restrictor orifice 258 and exits at a high linear velocity. For example only, the carrier gas may have a linear velocity that is greater than 300 meters/second, although other velocities may be used. One or more liquid precursor inlets 262 of the atomizer 252 receive liquid precursor via liquid flow controllers (LFCs) 264 and valves 266.

The drag of the high velocity gas on the liquid precursor provides a mechanism for atomization. The high velocity carrier gas transfers momentum to the liquid precursor, which causes a shearing effect. The shearing effect breaks the surface tension of liquid precursor and creates droplets. For example only, the droplets may have a diameter of 1-5 microns, although other larger or smaller droplet sizes may be used.

A thermal break or insulator 270 may be provided between the atomizer 252 and the heat exchanger/filter 256. The thermal break 270 decouples thermal characteristics of the heat exchanger/filter 256 and the atomizer 252. The heat exchanger/filter 256 heats the droplets so that the droplets vaporize. The heat exchanger/filter 256 includes, for example only, a band heater 272. The filter (not shown) of the heat exchanger/filter 256 may be arranged to receive and filter the output of the heat exchanger/filter 256. The filter has one or more membranes through which the vapor precursor passes. The output of the filter may form a nozzle 274. An additional heater (not shown) may be provided to heat the vaporized precursor at the outlet of the filter.

The heat exchanger/filter 256 may include a plurality of channels that heat and recirculate the droplets to form vapor precursor. Some of the channels may recirculate back near an inlet 280 of the heat exchanger/filter 256. Other channels may be directed towards the filter. The fine droplets are converted into vapor before reaching the filter.

Figure 6:
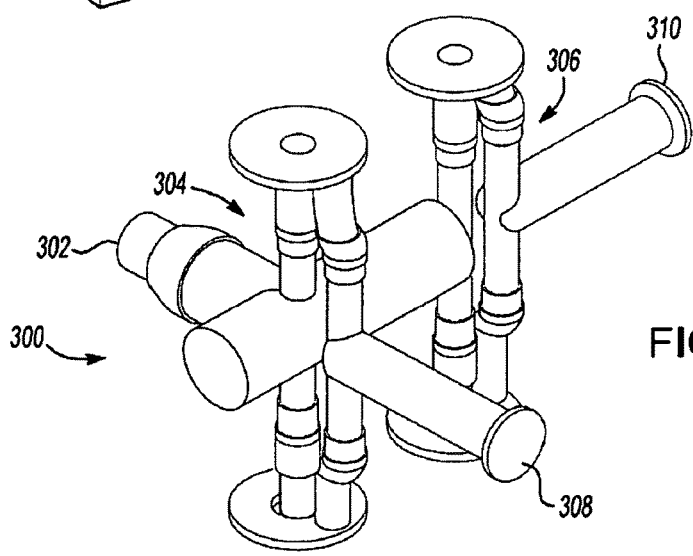
FIG. 6 illustrates an exemplary diverter according to the present disclosure.

Referring now to FIG. 6, an exemplary diverter 300 according to the present disclosure is shown. The diverter 300 includes an inlet 302, first and second valves 304, 306 and first and second outlets 308, 310. The first valve 304 of the diverter 300 may supply vapor precursor to a path leading to the chamber 108. A second valve 306 of the diverter 300 may supply vapor precursor to a diverter path leading to the vacuum pump 150. As can be appreciated, the paths may be connected in the opposite manner.

The first and second valves 304, 306 of the diverter 300 are preferably high conductance (low resistance) vapor valves having a low pressure drop and a fast response time. For example only, the first and second valves 304, 306 preferably have a response time that is less than 100 ms. In some implementations, the first and second valves 304, 306 have a composite flow coefficient that is greater than approximately 0.80. In some implementations, the first and second valves 304, 306 have a composite flow coefficient that is greater than approximately 0.87. The first and second valves 304, 306 may also be heated during operation. In some implementations, the valves 304, 306 operate at temperatures up to 150° C. In other implementations, the valves 304, 306 operate at temperatures up to 250° C. The first and second valves 304, 306 of the diverter 300 may be diaphragm valves made of stainless steel, although other types of valves and materials may be used.

Figure 7A:
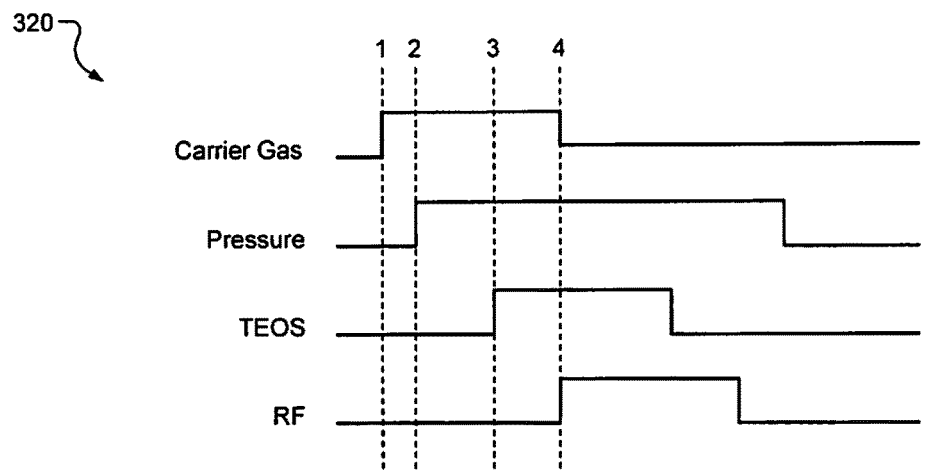
FIGS. 7A and 7B illustrate timing of non-diverting and diverting operation, respectively.
Figure 7B:
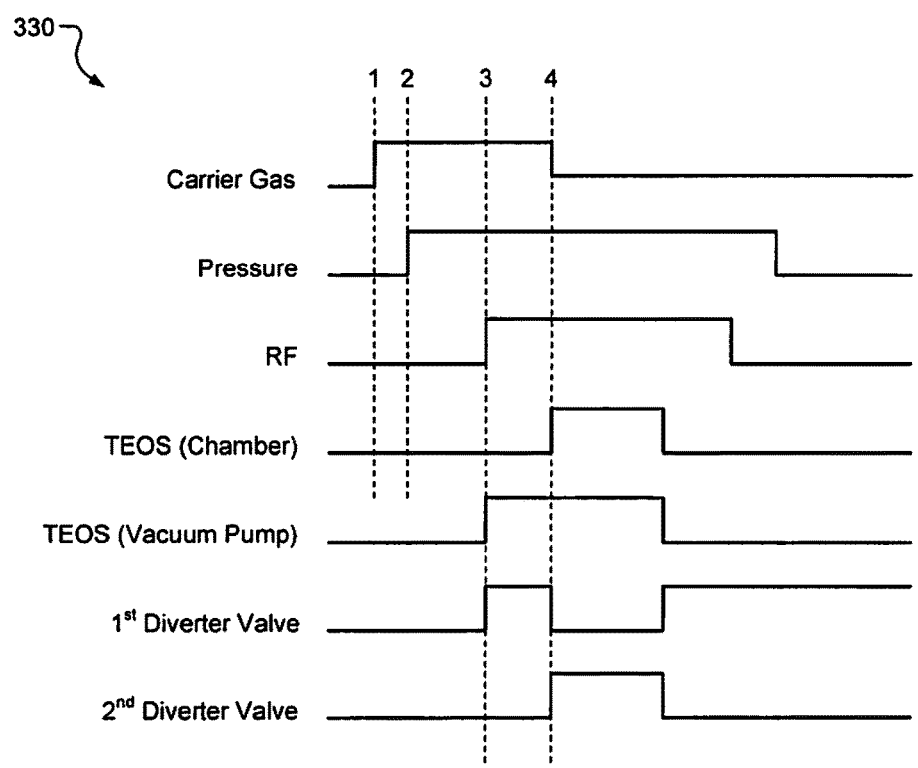

Referring now to FIGS. 7A and 7B, timing of non-diverting 320 and diverting 330 operation, respectively, are shown. For example only, the precursor may be TEOS and the carrier gas may be oxygen ($O_2$) and helium (He). As can be appreciated, other precursors and carrier gases can be used. In FIG. 7A, the carrier gas is supplied at time 1, the TEOS is supplied to the chamber at time 3 and the plasma (RF) is started at time 4. Pressure increases accordingly at time 2. At time 4, the He supplied in the carrier gas is stopped and only the $O_2$ is supplied as the carrier gas. Subsequently, the TEOS is turned off after a first period and then the plasma is turned off a second period after the first period. However, TEOS is not diverted during turn on or after the bulk deposition step. Therefore, the TEOS continues to reach the chamber 108 and additional unwanted deposition occurs.

In FIG. 7B, the carrier gas is supplied at time 1, the plasma is started at time 3 and the TEOS is supplied but diverted by the diverter 300 at least until the TEOS has an opportunity to reach steady state. Pressure increases accordingly at time 2. At time 4, the He supplied in the carrier gas is stopped and only the $O_2$ is supplied as the carrier gas. After reaching steady state at time 4, the diverter 300 supplies the TEOS to the chamber 108. After a first period, the TEOS is turned off to the chamber 108 using the diverter 300. Then, after a second period after the first period, the plasma is turned off. As will be described further below, unwanted deposition is reduced.

As can be appreciated, the timing of the first and second valves 304, 306 of the diverter 300 can be adjusted to suit a particular application. For example, when transitioning from diverting the TEOS to supplying the TEOS in the chamber 108, the second valve 306 of the diverter 300 (to the chamber 108) can be opened a first predetermined overlap period before closing the first valve 304 of the diverter 300 (to the vacuum pump 150). Likewise, when transitioning from supplying the TEOS in the chamber to diverting the TEOS, the first valve 304 of the diverter 300 (to the vacuum pump 150) can be opened a second predetermined overlap period before closing the second valve 306 of the diverter 300 (to the chamber 108).

Referring now to FIGS. 8A and 8B, adders on a conventional wafer 360 and on a wafer 370 processed according to the present disclosure, respectively, are shown. In particular, Oxygen and TEOS exposed wafers after decorating with AHM film are shown for both standard system and the vapor delivery system described herein. While the standard system has approximately 800 adders at 0.085 μm, the vapor delivery system according to the present disclosure has approximately 80 adders at 0.085 μm. Thus, the vapor delivery system according to the present disclosure shows improved vaporization as compared to the standard system.

Referring now to FIG. 9, thickness is shown as a function of time for a conventional wafer 380 and a wafer 390 processed according to the present disclosure, respectively, after a bulk deposition step. Film interfaces are shaped by unwanted deposition that happens after bulk deposition is complete. This unwanted deposition happens during a step when the precursor liquid/vapor volume left in the system is at a lower concentration than in the bulk deposition step. This leads to films with different properties. Minimizing residue volume (liquid/vapor left to expel when liquid flow is turned off) has a direct impact on liquid-based PECVD processes.

In addition, flow "on" transient volume also affects wafer results. Flow "on" transient volume is defined as the volume of liquid that passes through a vaporizer prior to steady state flow. Without a diverter, the flow "on" transient volume causes marginal wafer to wafer uniformity and defects. Selectively diverting vapor downstream of the vaporizer minimizes residual unwanted deposition, smoothes operation at flow "on" and improves wafer-to-wafer uniformity.

FIGS. 10A and 10B are charts illustrating adders for a conventional wafer 400 and a wafer 410 processed according to the present disclosure. FIGS. 10A and 10B compare in-film performance of ILDS and the vapor delivery system according to the present disclosure for 3500 A thick TEOS deposited using a first process where plasma is provided before TEOS delivery. While the standard system has approximately 20 adders @ 0.1 μm, the vapor delivery system according to the present disclosure has less than 5 adders.

Figure 11:
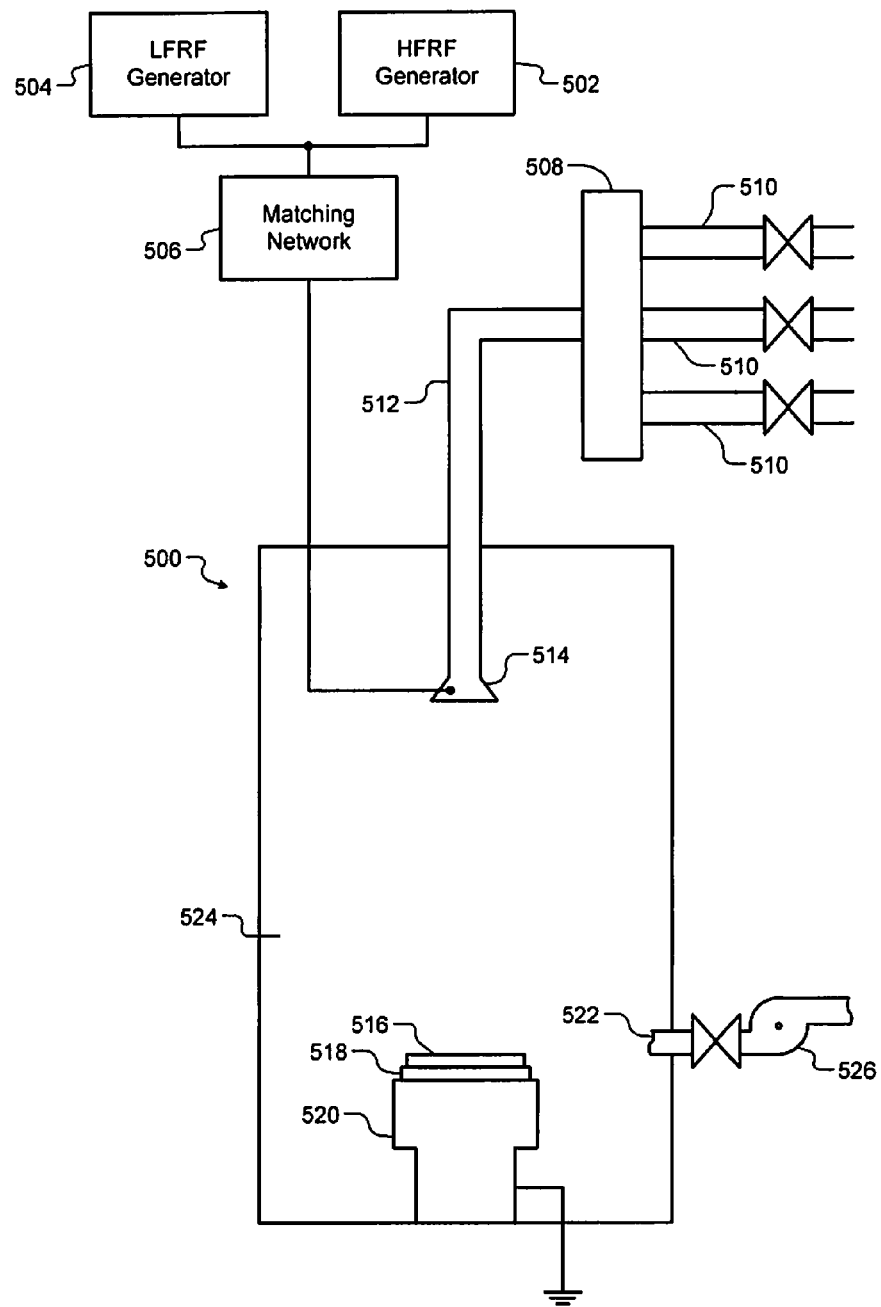
FIG. 11 is a functional block diagram of an exemplary CVD system according to the present disclosure.

Referring now to FIG. 11, an exemplary CVD system is shown. The deposition of film is preferably implemented in a plasma enhanced chemical vapor deposition (PECVD) system. The PECVD system may take many different forms. The PECVD system includes one or more chambers or "reactors" (sometimes including multiple stations) that house one or more wafers and are suitable for wafer processing. Each chamber may house one or more wafers for processing. The one or more chambers maintain the wafer in a defined position or positions (with or without motion within that position, e.g. rotation, vibration, or other agitation). A wafer undergoing deposition may be transferred from one station to another within a reactor chamber during the process. Of course, the film deposition may occur entirely at a single station or any fraction of the film may be deposited at any number of stations.

While in process, each wafer is held in place by a pedestal, wafer chuck and/or other wafer holding apparatus. For certain operations, the apparatus may include a heater such as a heating plate to heat the wafer.

For example, a reactor 500 in FIG. 11 includes a process chamber 524, which encloses other components of the reactor and contains the plasma. The plasma may be generated by a capacitor type system including a showerhead 514 working in conjunction with a grounded heater block 520. A high-frequency RF generator 502, connected to a matching network 506, and a low-frequency RF generator 504 are connected to the showerhead 514. The power and frequency supplied by matching network 506 is sufficient to generate plasma from the process gas.

Within the reactor, a wafer pedestal 518 supports a substrate 516. The pedestal 518 typically includes a chuck, a fork, or lift pins to hold and transfer the substrate during and between the deposition and/or plasma treatment reactions. The chuck may be an electrostatic chuck, a mechanical chuck or various other types of chuck.

The process gases are introduced via inlet 512. Multiple source gas lines 510 are connected to manifold 508. The gases may be premixed or not. Appropriate valving and mass flow control mechanisms are employed to ensure that the correct gases are delivered during the deposition and plasma treatment phases of the process.

Process gases exit chamber 524 via an outlet 522. A vacuum pump 526 (e.g., a one or two stage mechanical dry pump and/or a turbomolecular pump) draws process gases out and maintains a suitably low pressure within the reactor by a close loop controlled flow restriction device, such as a throttle valve or a pendulum valve.

It is possible to index the wafers after every deposition and/or post-deposition plasma anneal treatment until all the required depositions and treatments are completed, or multiple depositions and treatments can be conducted at a single station before indexing the wafer.

Figure 12:
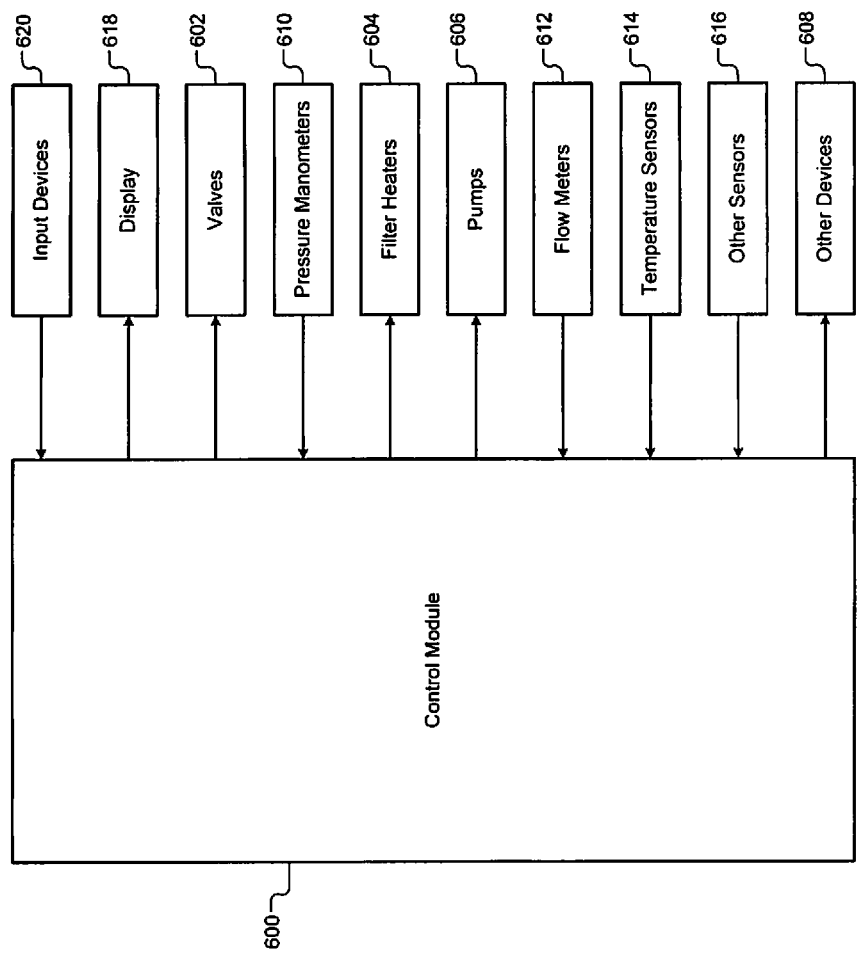
FIG. 12 is a functional block diagram illustrating a control module for controlling the system of FIGS. 1, 2 and 11 according to the present disclosure.

Referring now to FIG. 12, a control module 600 for controlling the systems of FIGS. 1, 2 and 11 is shown. The control module 600 may include a processor, memory and one or more interfaces. The control module 600 may be employed to control devices in the system based in part on sensed values. For example only, the control module 600 may control one or more of valves 602, filter heaters 604, pumps 606, and other devices 608 based on the sensed values and other control parameters. The control module 600 receives the sensed values from, for example only, pressure manometers 610, flow meters 612, temperature sensors 614, and/or other sensors 616. The control module 600 may also be employed to control process conditions during precursor delivery and deposition of the film. The control module 600 will typically include one or more memory devices and one or more processors.

The control module 600 may control activities of the precursor delivery system and deposition apparatus. The control module 600 executes computer programs including sets of instructions for controlling process timing, delivery system temperature, pressure differentials across the filters, valve positions, mixture of gases, chamber pressure, chamber temperature, wafer temperature, RF power levels, wafer chuck or pedestal position, and other parameters of a particular process. The control module 600 may also monitor the pressure differential and automatically switch vapor precursor delivery from one or more paths to one or more other paths. Other computer programs stored on memory devices associated with the control module 600 may be employed in some embodiments.

Typically there will be a user interface associated with the control module 600. The user interface may include a display 618 (e.g. a display screen and/or graphical software displays of the apparatus and/or process conditions), and user input devices 620 such as pointing devices, keyboards, touch screens, microphones, etc.

Computer programs for controlling delivery of precursor, deposition and other processes in a process sequence can be written in any conventional computer readable programming language: for example, assembly language, C, C++, Pascal, Fortran or others. Compiled object code or script is executed by the processor to perform the tasks identified in the program.

The control module parameters relate to process conditions such as, for example, filter pressure differentials, process gas composition and flow rates, temperature, pressure, plasma conditions such as RF power levels and the low frequency RF frequency, cooling gas pressure, and chamber wall temperature.

The system software may be designed or configured in many different ways. For example, various chamber component subroutines or control objects may be written to control operation of the chamber components necessary to carry out the inventive deposition processes. Examples of programs or sections of programs for this purpose include substrate positioning code, process gas control code, pressure control code, heater control code, and plasma control code.

A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition and flow rates and optionally for flowing gas into the chamber prior to deposition in order to stabilize the pressure in the chamber. A filter monitoring program includes code comparing the measured differential(s) to predetermined value(s) and/or code for switching paths. A pressure control program may include code for controlling the pressure in the chamber by regulating, e.g., a throttle valve in the exhaust system of the chamber. A heater control program may include code for controlling the current to heating units for heating components in the precursor delivery system, the substrate and/or other portions of the system. Alternatively, the heater control program may control delivery of a heat transfer gas such as helium to the wafer chuck.

Examples of sensors that may be monitored during deposition include, but are not limited to, mass flow control modules, pressure sensors such as the pressure manometers 610, and thermocouples located in delivery system, the pedestal or chuck (e.g. the temperature sensors 614). Appropriately programmed feedback and control algorithms may be used with data from these sensors to maintain desired process conditions. The foregoing describes implementation of embodiments of the invention in a single or multi-chamber semiconductor processing tool.

The foregoing description of the embodiments has been provided for purposes of illustration and description. It is not intended to be exhaustive or to limit the invention. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the invention, and all such modifications are intended to be included within the scope of the invention.

What is claimed is:

1. A method for supplying vapor to a chamber in a plasma-enhanced chemical vapor deposition (PECVD) system, comprising:
   providing a first diverter valve that, when open, diverts vapor away from the chamber, and a second diverter valve that, when open, supplies the vapor to the chamber; and
   supplying a carrier gas to the chamber;
   after supplying the carrier gas,
      creating plasma in the chamber while a substrate is in the chamber;
      opening the first diverter valve and closing the second diverter valve;
      supplying the vapor by vaporizing at least one liquid precursor in a carrier gas;
      after a first predetermined period sufficient for the vapor to reach steady-state flow, closing the first diverter valve and opening the second diverter valve to supply the vapor to the chamber;
      after a second predetermined period following the first predetermined period, opening the first diverter valve and closing the second diverter valve to stop supplying the vapor to the chamber; and
      after a third predetermined period following the second predetermined period, turning off the plasma.

2. The method of claim 1, further comprising:
   providing a first fluid path that includes a first filter that filters the vapor flowing from a vapor supply to the chamber;
   providing at least one second fluid path that is parallel to the first fluid path and that includes a second filter that filters vapor flowing from the vapor supply to the chamber; and
   using a plurality of valves to switch vapor delivery to the chamber between the first fluid path and the second fluid path.

3. The method of claim 2, further comprising:
   monitoring a first pressure on a vapor supply side of the first fluid path and the at least one second fluid path;
   monitoring a second pressure on a chamber side of the first path and the at least one second path; and
   determining a pressure differential based on the first and second pressures.

4. The method of claim 3, further comprising generating a filter change indication when the pressure differential is greater than a predetermined threshold.

5. The method of claim 4, further comprising selectively opening and closing the plurality of valves in response to user input.

6. The method of claim 3, further comprising controlling the plurality of valves to change one of the first fluid path and the second fluid path to the other of the first fluid path and the second fluid path when the pressure differential is greater than a predetermined threshold.

7. The method of claim 2, further comprising a third fluid path that provides fluid communication between at least one purge valve, the first fluid path and the at least one second fluid path, and a vacuum pump.

8. The method of claim 2, further comprising heating, using a heat exchanger, fluid flowing through the first fluid path and the at least one second fluid path.

9. The method of claim 1, wherein the at least one liquid precursor comprises tetraethyl orthosilicate (TEOS).

10. The method of claim 1, wherein the first and second diverter valves have a composite flow coefficient that is greater than 0.80 and a response time that is less than 100 ms.

11. A method for supplying vapor to a chamber in a plasma-enhanced chemical vapor deposition (PECVD) system, the method comprising:
  supplying vapor by vaporizing at least one liquid precursor in a carrier gas;
  providing a diverter including a first diverter valve that, when open, diverts the vapor away from the chamber, and a second diverter valve that, when open, diverts the vapor to the chamber, wherein:
  the carrier gas is supplied at a first time;
  plasma is created in the chamber while a substrate is in the chamber at a second time after the first time;
  the first diverter valve is open and the second diverter valve is closed at a third time, which is after the second time, when the at least one liquid precursor is supplied to divert the vapor away from the chamber;
  the first diverter valve is closed and the second diverter valve is open at a fourth time, after the third time, when the at least one liquid precursor is supplied to supply the vapor to the chamber;
  the first diverter valve is opened and the second diverter valve is closed at a fifth time, after the fourth time, to stop supplying the vapor to the chamber; and
  the plasma is turned off at a sixth time after the fifth time.

* * * * *